United States Patent

[11] 3,614,541

[72] Inventor William A. Farrand
Fullerton, Calif.
[21] Appl. No. 814,306
[22] Filed Apr. 8, 1969
[45] Patented Oct. 19, 1971
[73] Assignee North American Rockwell Corporation

[54] PACKAGE FOR AN ELECTRONIC ASSEMBLY
2 Claims, 6 Drawing Figs.

[52] U.S. Cl. .......... 317/101, 29/624
[51] Int. Cl. .......... H05k 1/04
[50] Field of Search .......... 339/275; 29/624–628; 317/101 A, 101 D, 101 CM, 101

[56] References Cited

UNITED STATES PATENTS

| | | | |
|---|---|---|---|
| 2,803.788 | . 8/1957 | Sanders, Jr. | 317/101 D UX |
| 2,816,252 | 12/1957 | Sanders, Jr. | 317/101 D UX |
| 2,995,686 | 8'1961 | Selvin | 317/101 D UX |
| 3,264,525 | 8/1966 | Swengel et al. | 317/101 C UX |
| 3,368,115 | 2/1968 | Hoffman | 339/17 N UX |
| 3,370,203 | 2/1968 | Kravitz et al | 317/101 D UX |
| 3,487,541 | 1/1970 | Boswell | 174/FP UX |

OTHER REFERENCES

Betz et al., " Monolithic Chip Carrier," IBM Tech. Disclosure Bull., vol. 9, no. 11, April 1967, p. 1511 (174–FP).

*Primary Examiner*—David Smith, Jr.

*Attorneys*—William R. Lane, L. Lee Humphries and Robert G. Rogers

ABSTRACT: The package houses an electronic assembly comprising a plurality of modules having integrated circuits secured to the module boards. Wiring patterns on each board interconnect integrated circuit leads and connect the circuits to the module output contacts formed around the periphery of the board.

The housing sides have interior slots which are parallel to the edges of the module boards and include conducting strips which are perpendicular to the slots and spaced according to the spacing of the module output contacts.

The edges of the modules are inserted into the slots for interconnecting corresponding output contacts of the modules through the conducting strips. At least one housing cover plate includes a circuit pattern on its interior surface which has contact terminals about its periphery and connecting pins on its external surface which are electrically connected to the circuit pattern. The plate is placed over the top of the assembled modules for electrically connecting the corresponding contacts of the modules through its circuit pattern to the connecting pins. The other housing cover plate which may or may not be provided with a circuit pattern and connecting pins completes the package.

After the package has been assembled, it is subjected to an environment for fusing the module output contacts to the conducting strips and for fusing the cover plates to the housing so that a package can be produced with fused mechanical, electrical, and thermal connections being made between the modules of electronic system and the package which is also hermetically sealed.

INVENTOR.
WILLIAM A. FARRAND

BY Robert G. Rogers
ATTORNEY

INVENTOR

WILLIAM A. FARRAND

BY

Robert G Rogers

ATTORNEY

INVENTOR.
WILLIAM A. FARRAND
BY Robert G Rogers
ATTORNEY

INVENTOR.
WILLIAM A. FARRAND
BY Robert G Rogers
ATTORNEY

PACKAGE FOR AN ELECTRONIC ASSEMBLY

BACKGROUND OF THE INVENTION

1. Field of the Invention

The invention relates to a package for electronic assemblies and more particularly to a package which provides electrical, mechanical and thermal connections to the modules within the package.

2. Description of Prior Art

Present electronic technologies have made it necessary to develop production oriented miniaturized packaging systems for the miniaturized electronic systems. For example, a hermetically sealed package may be required for a computer weighing less than 3 ounces and comprised of ceramic module boards 1 inch by 2 inches and 1/32 of an inch thick.

In designing a package, consideration must be given to the testing of the enclosed system after assembly as well as to the mechanical and electrical connections of the modules inside the package. In addition, some means must be provided for removing the heat from the circuits on the modules to prevent overstressing the components.

A uniform production process for the modules should be maintained so that imperfect circuit chips can be discarded without undesirable performance results from the assembled system. If the uniform process is maintained, testing of the assembled system will be substantially facilitated. It will be possible to readily locate a malfunctioning chip and remove that chip without interfering with system performance.

The invention described herein provides the means necessary to accommodate the miniaturized systems of the present art.

SUMMARY OF THE INVENTION

Briefly, the present invention provides a package for miniaturized electronic assemblies. The package includes a housing with interior slots for accommodating the edges of module boards comprising an electronic system. Conducting rails, or strips, are formed on the slotted surfaces for contacting corresponding output contacts of the modules when the modules are inserted into the slots. Electrical communication is made to the modules through connecting pins on at least one of the cover plates of the package. The pins are electrically connected to a circuit on interior side of the cover which also includes output contacts corresponding to the conducting rails of the housing. The leads of the module circuits are flexibly attached to the module board so that changes in temperature do not interfere with the operation of the circuit.

After the modules and cover plates have been assembled, the package is subjected to an environment for fusing the individual members together to produce a hermetically sealed package which provides mechanical, electrical and thermal connections to the modules.

Therefore, it is an object of this invention to provide a hermetically sealed package which provides mechanical, electrical and thermal connections to an enclosed electrical system.

It is another object of this invention to provide a package having slotted sides with conducting rails for accommodating the edges of the modules comprising a packaged system and for interconnecting corresponding leads of the modules.

It is another object of this invention to provide a package in which circuits of the modules are flexibly attached to the module boards to permit dimensional changes due to changes in temperature without damage to the circuits.

It is still a further object of this invention to provide a packaging system in which the sides of the package provide a packaging system in which the sides of the package provide mechanical, electrical, and thermal connections to the modules of the packaged system.

It is still a further object of this invention to provide a package which is hermetically sealed while simultaneously providing mechanical, electrical, and thermal connections to the modules of the packaged electrical system.

A further object of this invention is to provide a process and means for simultaneously fusing the module output contacts of an electronic system to conducting strips of a package for providing mechanical, electrical, and thermal connections to the packaged electronic system.

A still further object of this invention is to provide a package for electronic assemblies that is consistent with uniform production and testing techniques.

These and other objects of this invention will become more apparent during the description of the drawings which follows:

DESCRIPTION OF PREFERRED EMBODIMENTS

Figure 1:
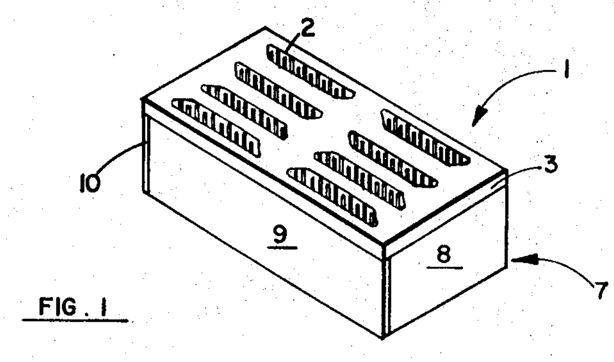
FIG. 1 illustrates a completed package including sockets in a connector shroud for receiving electrical cables.

FIG. 1 illustrates an assembled package 1 for an electronic system including sockets 2 in connector shroud 3 for providing electrical communications between the packaged system and other systems such as power supplies, display devices, input-output equipment, etc.

The sides 8, 9, 10 and 11 (not shown) forming housing 7 sequentially overlap so that alternate edges of adjacent sides are flush mounted. Additional information on the overlapping of the different sides is given in connection with FIG. 5.

Figure 2:
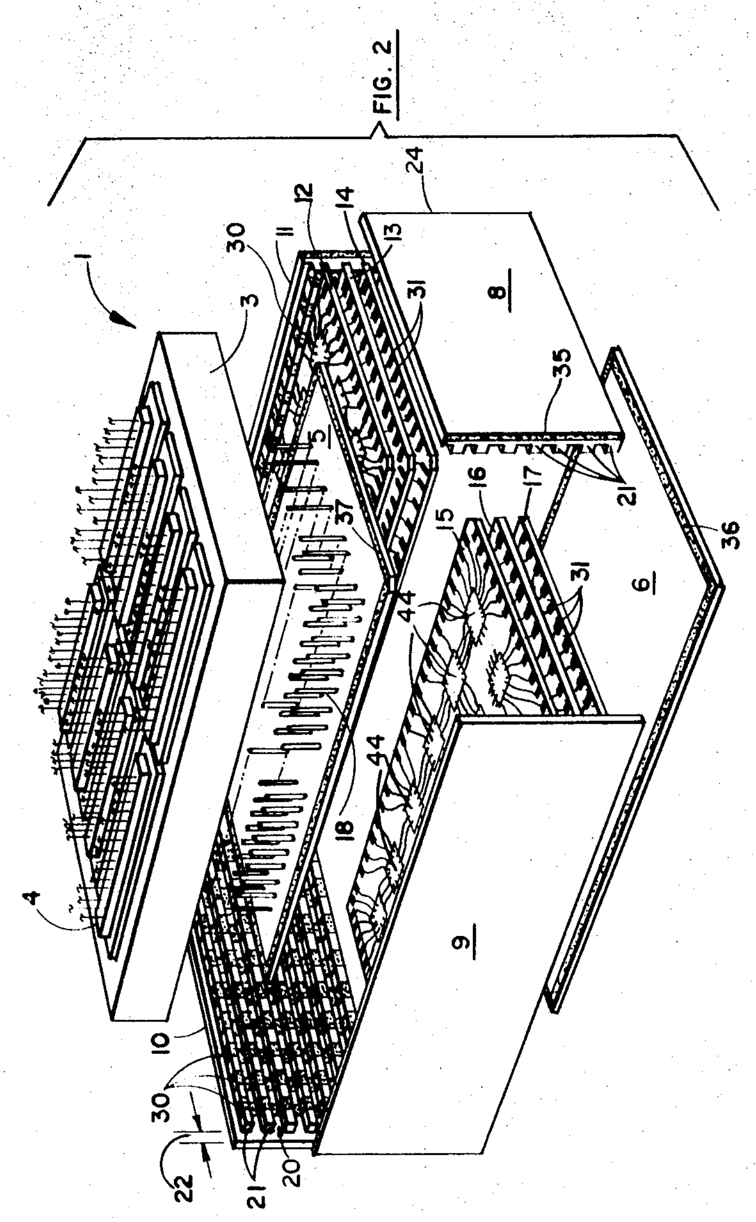
FIG. 2 illustrates a partially exploded view of the package.

FIG. 2 illustrates a partially exploded view of package 1 for the electronic system represented by modules 12 through 17. Housing sides 8, 9, 10 and 11 are also illustrated. Cable plugs 4 are shown inserted in the sockets of the shroud 3 for mating with connector pins represented generally by numeral 18.

The inner surfaces of each of the sides 8–11 include slots represented generally by numeral 20 which extend parallel to the edges of modules 12 through 17. The slots on the opposite sides are matching so that each module mates with corresponding slots.

Ridges 21, formed on the inner surfaces of the sides, separate the slots. The ridges and therefore the slots are recessed from one end of each side to permit the sides to overlap. For example, the plurality of ridges 21 on side 10 are recessed by an amount 22 which approximately equals the thickness of side 9.

Conducting strips represented generally by 30 are formed on the inner surfaces of the sides of housing 7. The strips are perpendicular to the edges of the modules and the slots 20. Each strip is separated from each adjacent strip by a width equivalent to the spacing between the module output contact pads represented generally by 31. The contact pads are formed along the peripheries of the module board 12 through 17 and include a coating of conducting materials similar to the material of the conducting strips 30. Solder applied by known techniques may be used as a conducting metal.

It is pointed out that the conducting strips may be formed on a strip basis as shown. However, in an alternate embodiment, the entire inner surface of a side may be initially coated and afterwards notched to provide insulation between each of the remaining strips. In that embodiment, the ridges would be comprised of a series of adjacent teeth.

The package further comprises connector pin plate 5 which is assembled between shroud 3 and the first module board 12 of the electronic assembly of module boards. The bottom surface of the plate 5 rests on the top surface of the uppermost ridge of the plurality of ridges 21. The connector pins 18 may be soldered to the plate 5. The bottom surface of the plate is provided with an etched wiring pattern, as shown in FIG. 6, to interconnect the pins 18 with the conducting strips 30.

Figure 6:
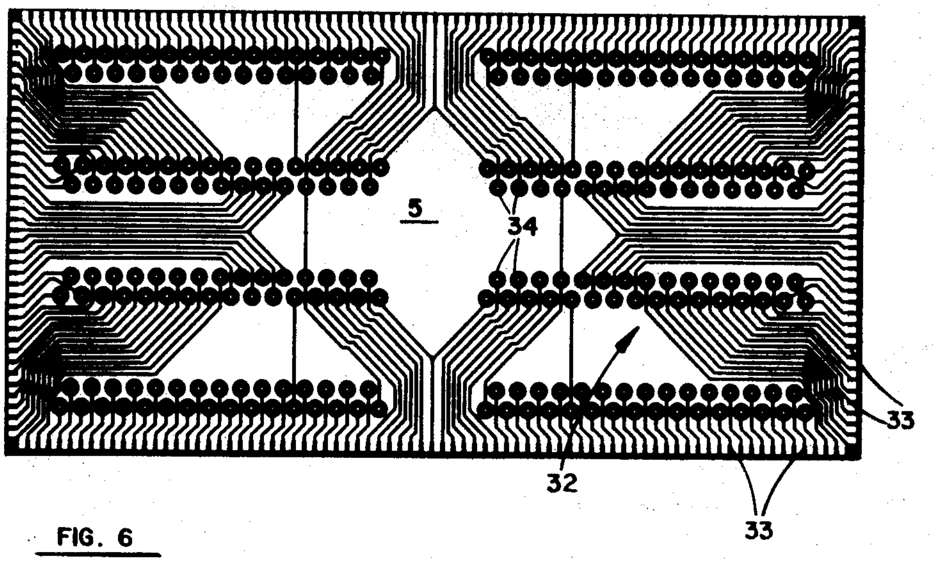
FIG. 6 illustrates a circuit pattern on a cover plate for connecting module contacts to pin connectors.

By referring to FIG. 6, one embodiment of a wiring pattern 32 for plate 5 can be seen. The FIG. 6 embodiment shows the bottom surface of plate 5 and also illustrates peripherally located contact pads 33. Circular areas 34 indicate the connecting points for connector pins 18 and the wiring pattern. The contact pads 33 are coated with a conducting metal similar to the metal of the conducting strips. The wiring pattern may be produced by etching techniques.

Figure 5:
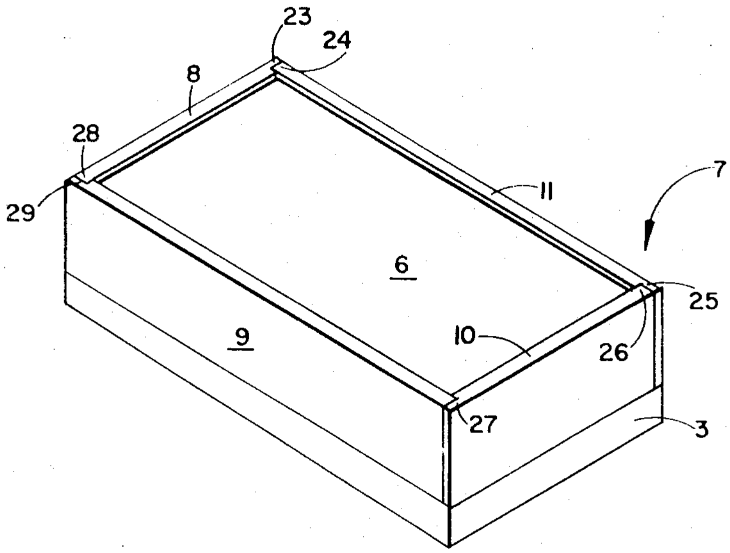
FIG. 5 illustrates the overlapping feature of the sides of the package.

FIG. 5 show more clearly how the sides of the package overlap. The housing 7 is shown upside down without a bottom coverplate to more clearly illustrate the interlocking aspect of the sides 8 through 11. Side 8 is recessed at end 23 so that the unrecessed end 24 of side 11 is flush mounted within the space provided. End 25 of side 11 is recessed so that end 26 of side 10 mounts flush within side 11. End 27 of side 10 is recessed so that side 9 mounts flush within side 10. Similarly, end 28 of side 8 mounts flush within the recessed space at end 29 of side 9. Connector shroud 3 is shown connected to the top of housing 7.

As partially shown in FIG. 2, metallic strips are provided on portions of the package 1 to fuse the various parts of the package together in a matter substantially shown in FIGS. 1 and 5. Strip 35 is provided on the edge of side 8 to connect that edge with the adjacent edge of side 9. Similar strips are provided on each edge of each side.

Figure 3:
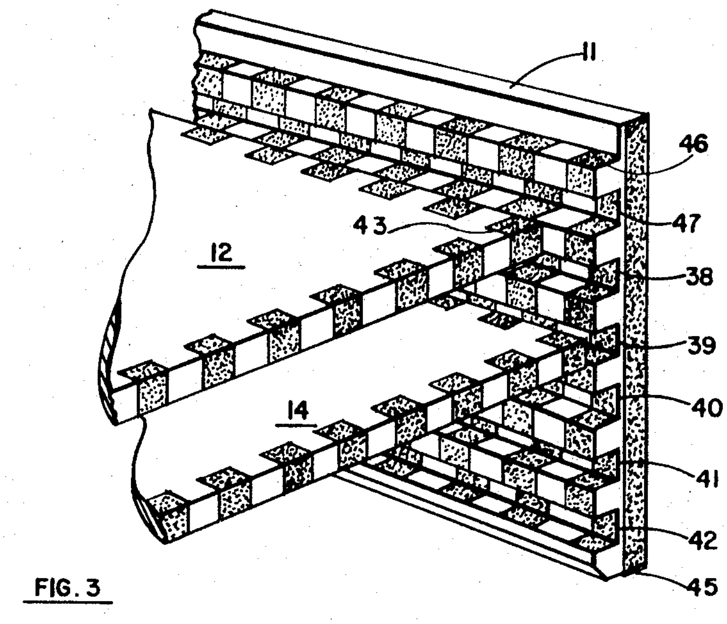
FIG. 3 illustrates a portion of one side of a package and two module boards which insert into the slots along the side.

Metallic strips such as strip 36 on bottom coverplate 6 and strip 37 on the top surface of plate 5 are also provided. A similar strip (not shown) is formed on the bottom surface of shroud 3. Strips are formed on the bottom surfaces of sides 8 through 11 as illustrated in FIG. 3 for side 11. The metallic strips may be comprised of a solder applied by known techniques. Although strips are shown on the bottom plate 6, for practical reasons, and in some embodiments, the entire surface may be coated.

The module boards 12 through 17, may be comprised of beryllia (BeO) substrates on which wiring patterns have been etched. The wiring patterns (not numbered) are only partially shown for convenience. Integrated circuit components designated generally by numeral 44, disposed on one or both surfaces of the substrates, are interconnected by the wiring pattern. The connection of one integrated circuit to a substrate is shown and described in connection with FIG. 4. The circuits on both sides of the board are interconnected through the conducting strips 30 along the inner sides of housing 7. The housing 7 may also be produced from beryllia since it has preferred electrical insulating and thermal conduction characteristics.

The boards may be produced by modern production techniques so that the characteristics of each circuit component is within the allowable range of the characteristics of the other circuit components. Therefore, it is easy to replace a defective board by another board without degrading the performance of the system.

In addition, since the boards may be symmetrically produced, in one embodiment, a computer system may be implemented which has varying amounts of storage capacity by simply inverting one or more of the module boards inside the housing 7.

Modern manufacturing techniques and use restrictions require that the boards of an electronic assembly be quickly, easily and reliably tested. For the FIG. 2 embodiment, testing could be easily accomplished by using a single test fixture. In that case, each board can be individually tested and the completed system could be individually tested without the requirements of elaborate test fixtures. Details on the test fixtures are not believed necessary to complete the description of the invention herein.

An enlarged view of one edge of side 11 and one embodiment of module boards 12 and 14 is shown in FIG. 3. Conducting strip 46 is coated on the inner surface of side 11 in a direction which is orthogonal to the direction of slots 47 and 38 through 42. When module board 12 is inserted into slot 47, the portion of the conducting strip 46 on the underside of slot 47 contacts the output contact pad 43 of module 12. Similar output contact pads appear on the underside of the module board and on the underside of all module boards so that electrical connections are made to the output contact pads on both sides of a module board simultaneously when a board is inserted into a slot. Metallic strips 45 on the bottom edge of side 11 permit side 11 to be connected to strip 36 of plate 6 as described earlier. Details such as the circuit pattern on the surfaces of the module boards have been omitted from the FIG. 3 embodiment for convenience. The difference between the board shown in FIG. 3 and the board shown in FIG. 2 is that the output contact pads wrap around the edges of the boards shown in FIG. 3. In FIG. 2, the contact pads do not wrap around the edge of the board.

In a typical embodiment, each side of a module board is large enough to accommodate 21 integrated circuits having dimensions of 100 by 150 mils. Integrated circuits on the module boards are represented generally by 44 and are often called integrated circuit chips or large-scale integration (LSI) chips.

The interconnections between the integrated circuit chips are by means of conductors on the face of the ceramic board using for example, 2-mil etched lines on 5-mil centers. In order to make the necessary interconnections, two layers of conductors may be required. In that case, prior to producing the second set of leads, or conductors, an insulating layer would be disposed over the top of the first layer of conductors.

In the particular embodiment shown in FIG. 2, the output contact pads of the modules have an approximate width of 10 mils under a space of 25-mils centers. For the embodiment shown, 232 contacts are provided on each 1-inch-by-2-inch module.

Each module contact pad is connected to the corresponding contact pad of every other module board of the electronic system through the conducting strip described above. Therefore, the order in which the module boards are connected into packages is of little consequence.

Figure 4:
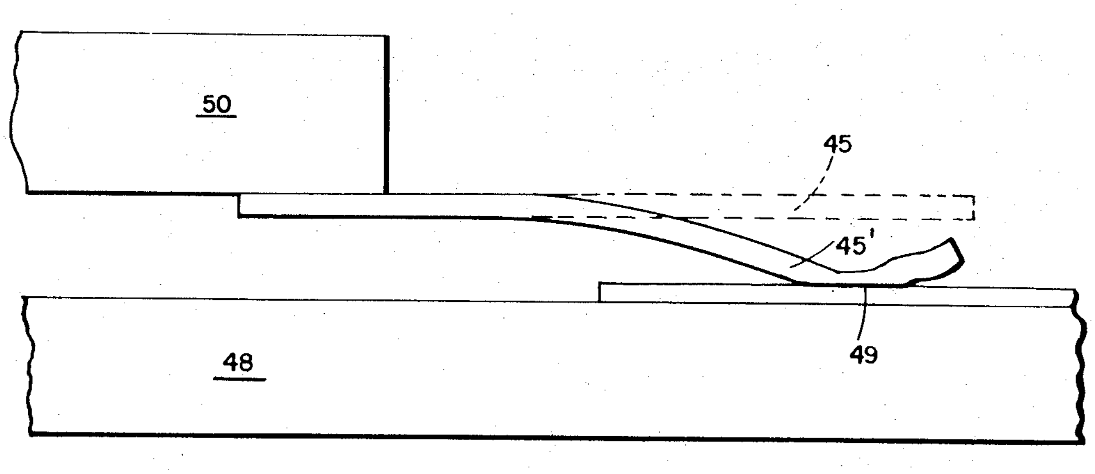
FIG. 4 illustrates a side view of an integrated circuit flexibly mounted on a module board.

The module boards are first prepared, for example, by etching conductor patterns, on a ceramic substrate, applying an insulation and then producing a second conducting pattern as indicated above. Subsequently, the ceramic board is fired. Afterwards, the beam leads of the integrated circuits are connected such as by welding or thermocompression bonding, An example of how beam leads 45 may be affixed to the conductors as shown in FIG. 4. During the joining process, the beam lead 45' is slightly elongated in both directions from the point 49 at which the weld occurs. As a result, the integrated circuit chip 50 is pushed upward relative to substrate 48 so that is flexibly mounted relative to the welded connection. Thereafter, when the chip undergoes dimensional changes due to temperature change, the flexible mounting permits the dimensions of the chip to change without undergoing excessive stresses and strains which is normally the case when a chip is secured to the board. The integrated circuit chips may be passivated by $Si_3N_4$.

After the integrated circuits have been attached and the boards inserted into the slots, the top, bottom and housing members are assembled. Then, the assembled package is placed in a cold oil bath which is raised to a temperature slightly above the temperature at which the conductor layers, solder for the described embodiment, reflows for forming the composite mechanical, electrical and thermal connections between the package and the electronic system. The temperature of the oil bath is then lowered and the assembled package is removed, washed and tested. Therefore, the package system is ready for normal operation.

I claim:

1. A package for an electronic assembly of module circuit boards having output contacts disposed around the edges of the module circuit boards, said package comprising, housing means including horizontally extending slots in the inner surfaces of the walls of said housing means, for mating with the edges of the module circuit boards, continuous conducting strips orthogonal to the edges of said module circuit boards on the inner surfaces of said housing means for electrically connecting corresponding output contacts of said module circuit boards, cover plates for hermetically sealing said housing means, at least one of said cover plates including a circuit on its inner surface having contacts for mating with said continuous conducting strips for electrically interconnecting the circuits of said module circuit boards in a predetermined electrical configuration, said output contacts and said continuous conducting strips having a fusible metal layer thereon whereby said module circuit boards are mechanically connected inside said slots.

2. The combination as recited in claim 1 including circuit components having leads flexibly attached to said module circuit boards and, said module circuit boards includes conductor patterns for interconnecting certain of said components and for connecting the leads from certain of said components to the module output contacts, the body of each of said components being suspended above the surface of the module boards by the leads of said component after said leads have been connected to a circuit of a module circuit board for enabling said component body to undergo dimensional changes relative to the surface of said module board as a result of environmental changes.